(12) United States Patent
Mahler et al.

(10) Patent No.: US 7,923,350 B2
(45) Date of Patent: Apr. 12, 2011

(54) METHOD OF MANUFACTURING A SEMICONDUCTOR DEVICE INCLUDING ETCHING TO ETCH STOP REGIONS

(75) Inventors: Joachim Mahler, Regensburg (DE); Edward Fuergut, Dasing (DE); Werner Kroeninger, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 212 days.

(21) Appl. No.: 12/207,196

(22) Filed: Sep. 9, 2008

(65) Prior Publication Data
US 2010/0059864 A1 Mar. 11, 2010

(51) Int. Cl.
*H01L 21/00* (2006.01)

(52) U.S. Cl. ........ 438/462; 438/460; 438/461; 438/463; 438/464; 257/62; 257/E21.238; 257/E23.002

(58) Field of Classification Search .......... 438/460–465; 257/620, E23.002, E21.238
See application file for complete search history.

(56) References Cited

U.S. PATENT DOCUMENTS

| | | | |
|---|---|---|---|
| 4,537,654 A * | 8/1985 | Berenz et al. ................ 438/176 |
| 5,040,020 A * | 8/1991 | Rauschenbach et al. ....... 355/53 |
| 5,332,469 A * | 7/1994 | Mastrangelo .................... 216/2 |
| 6,187,611 B1 | 2/2001 | Preston et al. |
| 6,624,522 B2 | 9/2003 | Standing et al. |
| 6,911,392 B2 | 6/2005 | Bieck et al. |
| 6,940,089 B2 | 9/2005 | Cheng et al. |
| 6,964,915 B2 | 11/2005 | Farnworth et al. |
| 7,227,176 B2 | 6/2007 | Wu et al. |
| 7,268,012 B2 | 9/2007 | Jiang et al. |
| 7,300,857 B2 | 11/2007 | Akram et al. |
| 2007/0082480 A1 * | 4/2007 | Kinzer et al. ................ 438/629 |
| 2008/0054479 A1 | 3/2008 | Watanabe |

FOREIGN PATENT DOCUMENTS

| | | |
|---|---|---|
| DE | 4411409 | 10/1995 |
| EP | 1148544 | 10/2001 |
| EP | 1 790 002 B1 | 3/2008 |

* cited by examiner

*Primary Examiner* — Charles Garber
*Assistant Examiner* — Yasser A Abdelaziez
(74) *Attorney, Agent, or Firm* — Dicke, Billig & Czaja, P.L.L.C.

(57) ABSTRACT

A method of manufacturing a semiconductor device. The method includes providing a wafer having a first face and a second face opposite the first face, selectively doping the wafer via the first face to selectively form etch stop regions in the wafer and etching the wafer at the second face to the etch stop regions.

11 Claims, 6 Drawing Sheets

US 7,923,350 B2

METHOD OF MANUFACTURING A SEMICONDUCTOR DEVICE INCLUDING ETCHING TO ETCH STOP REGIONS

BACKGROUND

Market demand for smaller, lighter, and more powerful electronic devices drives the development of more compact semiconductor devices and increased functionality. Demand for electronic devices, such as cellular telephones, personal digital assistants, and portable computing devices, contributes heavily to the overall market demand. Development of more compact semiconductor devices and increased functionality has led to thinner semiconductor chips and packaging technologies, such as wafer level packaging (WLP).

WLP refers to the technology of packaging semiconductor chips at the wafer level, instead of the traditional process of packaging semiconductor chips one at a time. WLP is a chip-scale packaging technology, since the resulting package is substantially the same size as the chip. Packaging via wafer level fabrication processes reduces packaging time and inventory, which reduces costs.

Development of more compact semiconductor devices and increased functionality has led to thinner vertical power transistors. Typically, vertical power transistors have two contacts on one face and one contact on an opposing face. In the on state, current flows from one face to the other face. A vertical power MOSFET, usually, has source and gate contacts on one face and a drain contact on the other face. The vertical power MOSFET exhibits an on resistance between the drain and source terminals, where the resistance of the epitaxial layer is a primary factor in the on resistance of the transistor. Manufacturing a thinner vertical power MOSFET is one way of decreasing the on resistance of the transistor.

For these and other reasons, there is a need for the present invention.

SUMMARY

One embodiment described in the disclosure provides a method of manufacturing a semiconductor device. The method includes providing a wafer having a first face and a second face opposite the first face, selectively doping the wafer via the first face to selectively form etch stop regions in the wafer and etching the wafer at the second face to the etch stop regions.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
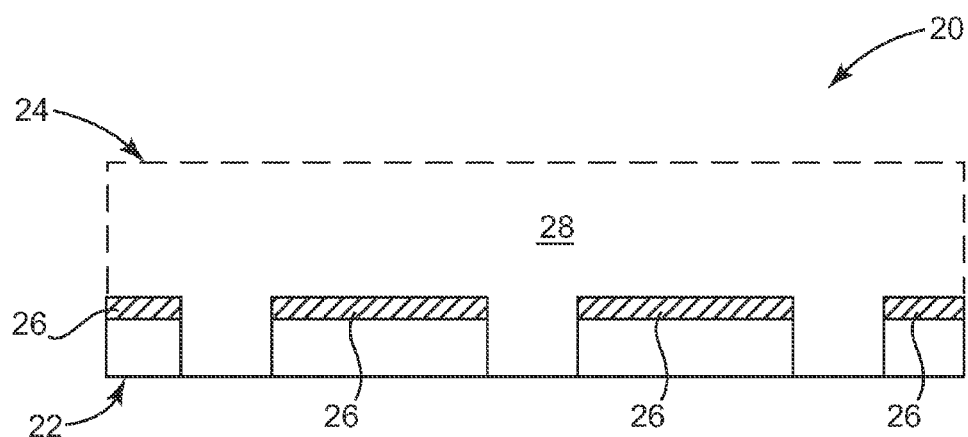
FIG. 1 is a diagram illustrating one embodiment of a semiconductor wafer.

FIG. 1 is a diagram illustrating one embodiment of a semiconductor wafer 20 having a first face 22 and a second face 24 that is opposite first face 22. Etch stop regions 26 are selectively formed in wafer 20 by selectively doping wafer 20 via first face 22. At least some semiconductor material 28 is removed via one or more processes, including etching at second face 24 down to etch stop regions 26. Also, at least some semiconductor material 28 that is between etch stop regions 26 is removed via etching at second face 24. In one embodiment, semiconductor material 28 is removed via grinding and etching at second face 24.

In one embodiment, wafer 20 includes an array of active areas, where each active area is an integrated circuit. Each of the active areas is situated at first face 22 and vertically below one of the etch stop regions 26. Wafer 20 is etched at second face 24, including between etch stop regions 26, until semiconductor devices are singulated from wafer 20. Each of the semiconductor devices includes one of the active areas at first face 22.

In one embodiment, wafer 20 includes an array of vertical power transistors, including contact pads at first face 22. Vertically below each of the etch stop regions 26, wafer 20 includes one or more contact pads at first face 22. Wafer 20 also includes other contact pads at first face 22 and between each of the etch stop regions 26. Wafer 20 is etched down to etch stop regions 26 and down to the other contact pads between etch stop regions 26 to open these contact pads. A metal layer is applied over the opened contact pads and over second face 24. Wafer 20 is singulated via a process, such as a mechanical process, which severs at least one of the metal layer and wafer material.

Etch stop regions 26 are selectively formed in wafer 20 via masking steps. In one embodiment, etch stop regions 26 are selectively formed by selectively doping wafer 20 via diffusing material through first face 22. In one embodiment, etch stop regions 26 are selectively formed by selectively doping wafer 20 via accelerating ions towards first face 22 so that the ions enter into wafer 20 at predetermined regions.

FIGS. 2-5 are diagrams illustrating one embodiment of a method of manufacturing semiconductor devices including integrated circuits.

Figure 2:
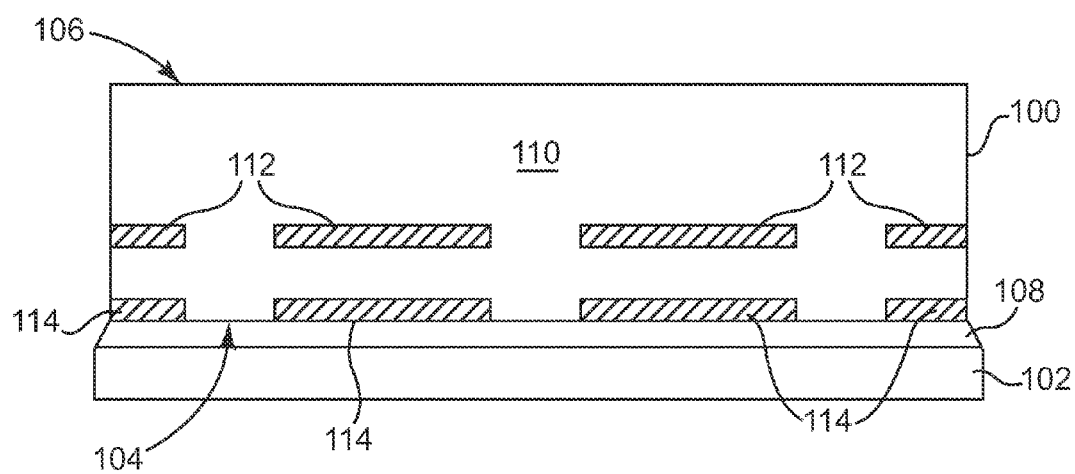
FIG. 2 is a diagram illustrating one embodiment of a semiconductor wafer attached to a wafer carrier.

FIG. 2 is a diagram illustrating one embodiment of a semiconductor wafer 100 attached to a wafer carrier 102. Wafer 100 has a first face 104 and a second face 106 that is opposite first face 104. Wafer 100 is attached to wafer carrier 102 at first face 104 via a wafer adhesive 108, which fixes or bonds wafer 100 to wafer carrier 102. Wafer 100 is similar to wafer 20. In one embodiment, wafer carrier 102 is glass.

Wafer 100 includes semiconductor material 110. Etch stop regions 112 are selectively formed in semiconductor material 110 by selectively doping wafer 100 via first face 104. In one embodiment, etch stop regions 112 are configured to be etched at $1/100$ the etch rate of semiconductor material 110. In one embodiment, etch stop regions 112 are from 5-100 micrometers from first face 104. In one embodiment, semiconductor material 110 is silicon.

Etch stop regions 112 are selectively formed in wafer 100 via masking steps. In one embodiment, etch stop regions 112 are selectively formed by selectively doping wafer 100 via diffusing material through first face 104. In one embodiment, etch stop regions 112 are selectively formed by selectively doping wafer 100 via accelerating ions through first face 104.

Wafer 100 includes an array of active areas 114 on first face 104. Each of the active areas 114 is an integrated circuit, such that wafer 100 includes an array of integrated circuits on first face 104. Also, each of the active areas 114 is situated vertically below one of the etch stop regions 112.

Figure 3:
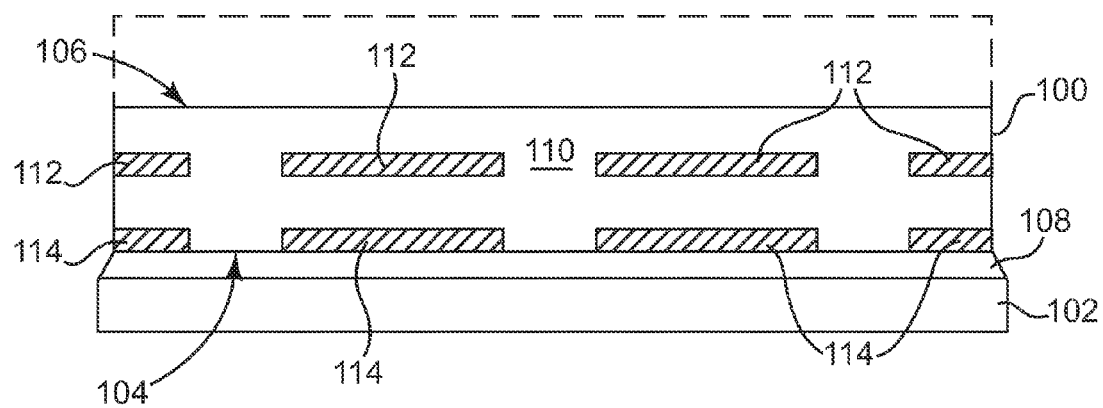
FIG. 3 is a diagram illustrating one embodiment of a wafer after removing some semiconductor material.

FIG. 3 is a diagram illustrating one embodiment of wafer 100 after removing some semiconductor material 110, as indicated via dotted lines. Wafer 100 includes the array of active areas 114 on first face 104 and wafer 100 remains attached to wafer carrier 102 at first face 104 via wafer adhesive 108. After removing some semiconductor material 110, second face 106 is closer to etch stop regions 112.

Semiconductor material 110 is removed at second face 106 via a mechanical process. In one embodiment, semiconductor material 110 is removed via grinding. In one embodiment, semiconductor material 110 is removed via a chemical mechanical polish (CMP).

Figure 4:
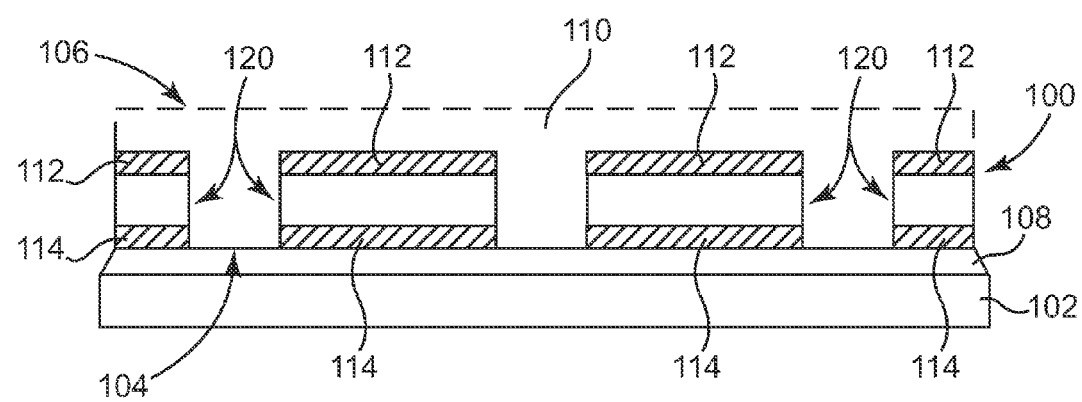
FIG. 4 is a diagram illustrating one embodiment of semiconductor devices attached to a wafer carrier.

FIG. 4 is a diagram illustrating one embodiment of semiconductor devices 120 attached to wafer carrier 102 via wafer adhesive 108. Semiconductor devices 120 are singulated from wafer 100 via etching away semiconductor material 110, as indicated via dotted lines. Each of the semiconductor devices 120 includes one of the active areas 114 at first face 104, vertically below one of the etch stop regions 112.

Wafer 100 is etched at second face 106 down to etch stop regions 112, which reduce the rate of etching. Wafer 100 is also etched at second face 106 to remove semiconductor material 110 between etch stop regions 112, i.e. between semiconductor devices 120. Semiconductor material 110 is etched away until semiconductor devices 120 are singulated from wafer 100. Etch stop regions 112 prevent semiconductor material 110 between each etch stop region 112 and active area 114 pair from being etched away.

Figure 5:
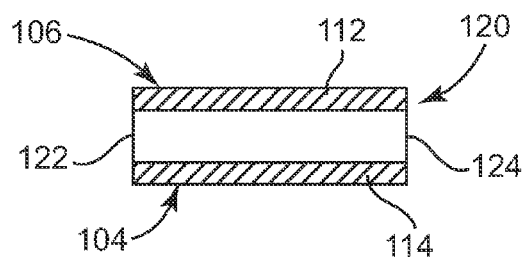
FIG. 5 is a diagram illustrating one embodiment of one of the semiconductor devices.

FIG. 5 is a diagram illustrating one embodiment of one of the semiconductor devices 120. Semiconductor device 120 is singulated from wafer 100 and removed from wafer carrier 102 and adhesive 108. Semiconductor device 120 includes a selectively formed etch stop region 112 at second surface 106 and one of the active areas 114 at first face 104, vertically below the etch stop region 112. Also, semiconductor device 120 includes edges 122 and 124, which are substantially at the edges of the selectively formed etch stop region 112.

FIGS. 6-11 are diagrams illustrating one embodiment of a method of manufacturing semiconductor devices that are vertical power transistors.

Figure 6:
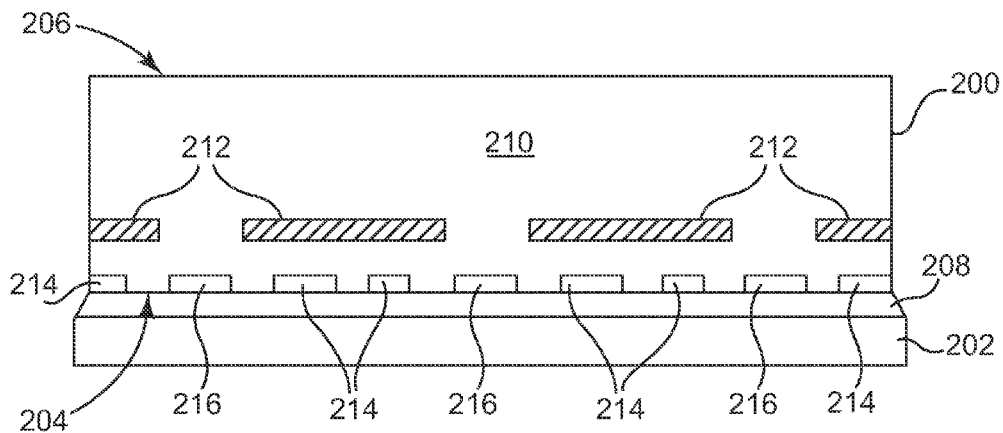
FIG. 6 is a diagram illustrating one embodiment of a semiconductor wafer that includes an array of power transistors.

FIG. 6 is a diagram illustrating one embodiment of a semiconductor wafer 200 attached to a wafer carrier 202. Wafer 200 has a first face 204 and a second face 206 that is opposite first face 204. Wafer 200 is attached to wafer carrier 202 at first face 204 via a wafer adhesive 208, which fixes or bonds wafer 200 to wafer carrier 202. Wafer 200 is similar to wafer 20. In one embodiment, wafer carrier 202 is glass.

Wafer 200 includes semiconductor material 210. Etch stop regions 212 are selectively formed in semiconductor material 210 by selectively doping wafer 200 via first face 204. In one embodiment, etch stop regions 212 are configured to be etched at $1/100$ the etch rate of semiconductor material 210. In one embodiment, etch stop regions 212 are from 5-100 micrometers from first face 204. In one embodiment, semiconductor material 210 is silicon.

Etch stop regions 212 are selectively formed in wafer 200 via masking steps. In one embodiment, etch stop regions 212 are selectively formed by selectively doping wafer 200 via diffusing material through first face 204. In one embodiment, etch stop regions 212 are selectively formed by selectively doping wafer 200 via accelerating ions through first face 204.

Wafer 200 includes first contact pads 214 and second contact pads 216. First contact pads 214 are situated on first face 204 vertically below etch stop regions 212 and second contact pads 216 are situated on first face 204 vertically between etch stop regions 212. Each of the first and second contact pads 214 and 216 is part of a power transistor, such that wafer 200 includes an array of power transistors.

Figure 7:
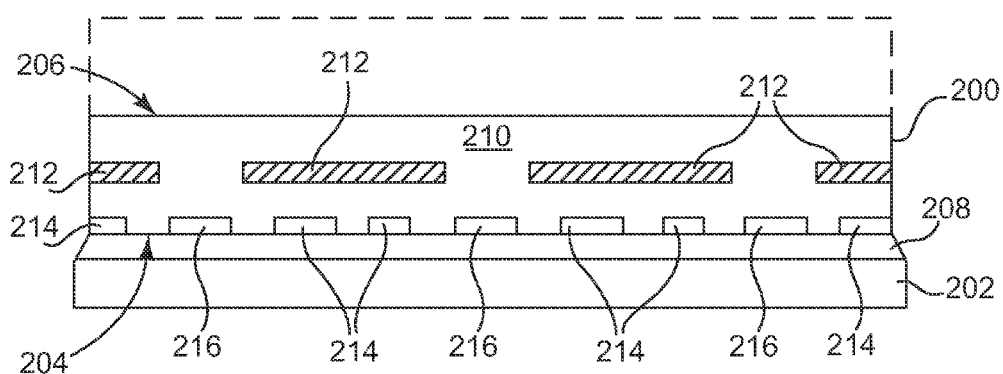
FIG. 7 is a diagram illustrating one embodiment of a wafer including power transistors after removing some semiconductor material.

FIG. 7 is a diagram illustrating one embodiment of wafer 200 after removing some semiconductor material 210, as indicated via dotted lines. Wafer 200 includes the first and second contact pads 214 and 216 on first face 204 and wafer 200 remains attached to wafer carrier 202 at first face 204 via wafer adhesive 208. After removing some semiconductor material 210, second face 206 is closer to etch stop regions 212.

Semiconductor material 210 is removed at second face 206 via a mechanical process. In one embodiment, semiconductor material 210 is removed via grinding. In one embodiment, semiconductor material 210 is removed via a chemical mechanical polish (CMP).

Figure 8:
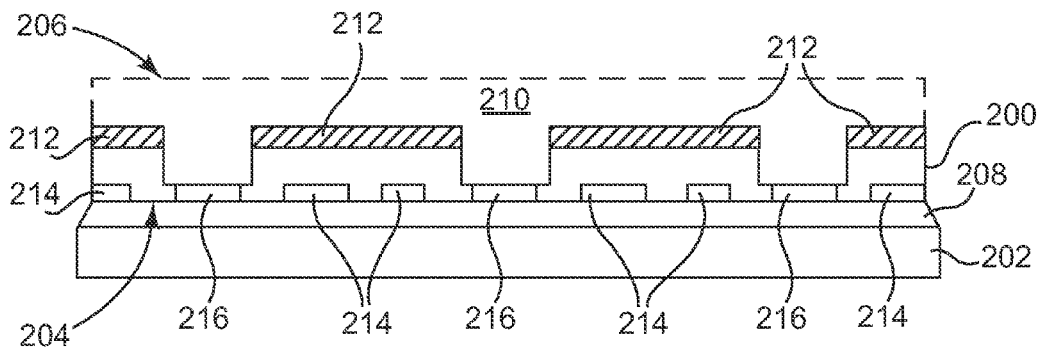
FIG. 8 is a diagram illustrating one embodiment of a wafer after etching away semiconductor material.

FIG. 8 is a diagram illustrating one embodiment of wafer 200 after etching away semiconductor material 210, as indicated via dotted lines. Wafer 200 includes the first and second contact pads 214 and 216 on first face 204 and wafer 200 remains attached to wafer carrier 202 at first face 204 via wafer adhesive 208.

Wafer 200 is etched at second face 206 down to etch stop regions 212, which reduce the rate of etching. Wafer 200 is also etched at second face 206 to remove semiconductor material 210 between etch stop regions 212, down to second contact pads 216. Semiconductor material 210 is etched away until second contact pads 216 are opened. Etch stop regions 212 prevent semiconductor material 210 between each etch stop region 212 and first contact pads 214 on first face 204 from being etched away.

Figure 9:
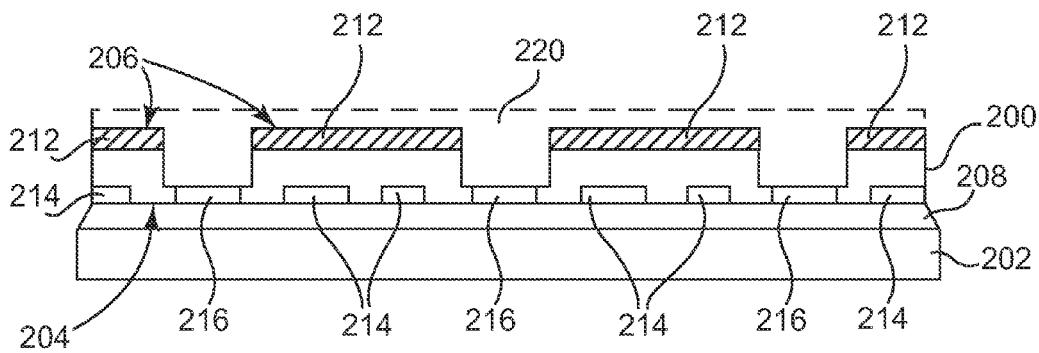
FIG. 9 is a diagram illustrating one embodiment of a wafer after applying a metal layer.

FIG. 9 is a diagram illustrating one embodiment of wafer 200 after applying a metal layer 220. Wafer 200 includes first and second contact pads 214 and 216 on first face 204 and wafer 200 remains attached to wafer carrier 202 at first face 204 via wafer adhesive 208.

Metal layer 220 is applied over the opened second contact pads 216 and second face 206, which is at etch stop regions 212. In one embodiment, metal layer 220 contacts drain contacts of vertical power transistors at etch stop regions 212, and first contact pads 214 contact source and gate contacts of the vertical power transistors.

Figure 10:
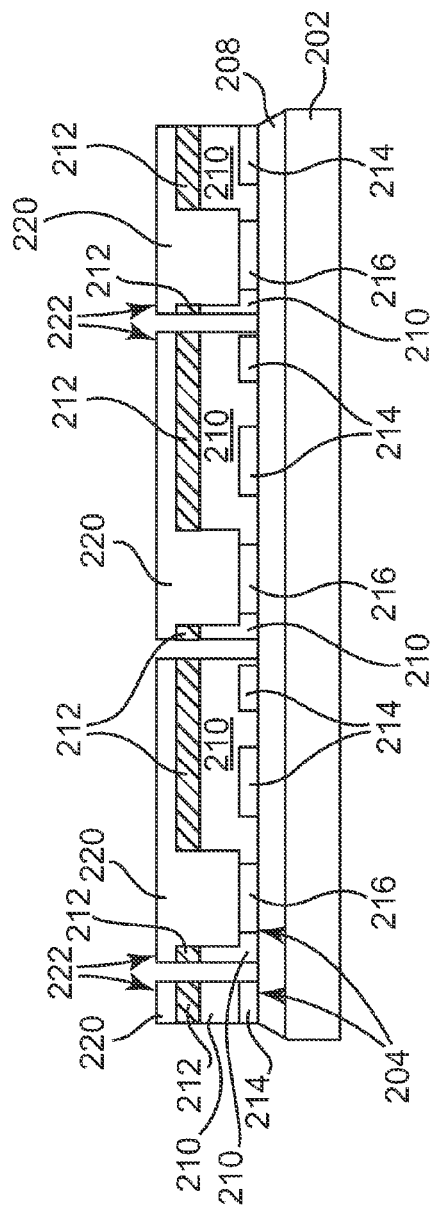
FIG. 10 is a diagram illustrating one embodiment of power transistors attached to a wafer carrier.

FIG. 10 is a diagram illustrating one embodiment of power transistors 222 attached to wafer carrier 202 via wafer adhesive 208. Power transistors 222 are singulated from wafer 200 via a process, such as a mechanical sawing process. The process severs metal layer 220 and semiconductor material 210. Each of the power transistors 222 includes two first contact pads 214 and one second contact pad 216 at first face 204. First contact pads 214 are situated vertically below etch stop regions 212 and second contact pads 216 are situated vertically between etch stop regions 212.

Figure 11:
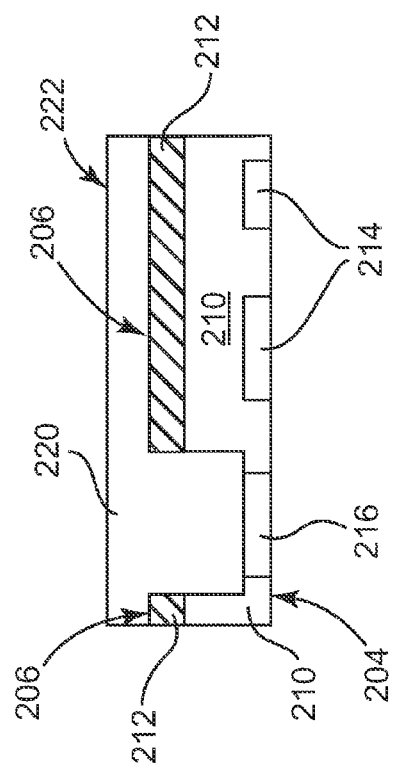
FIG. 11 is a diagram illustrating one embodiment of one of the power transistors that is singulated from a wafer.

FIG. 11 is a diagram illustrating one embodiment of one of the power transistors 222 that is singulated from wafer 200 and removed from wafer carrier 202 and wafer adhesive 208. Power transistor 222 includes a selectively formed etch stop region 212 at second face 206 and first and second contact pads 214 and 216 at first face 204. The first contact pads 214 are situated vertically below etch stop region 212, and the second contact pad 216 is situated vertically between etch stop regions 212 and substantially at the edges of the selectively formed etch stop regions 212.

Metal layer 220 contacts second contact pad 216 and second face 206 at the etch stop regions 212. Metal layer 220 contacts the drain contact of the vertical power transistor at one of the etch stop regions 212 and extends the drain contact at second face 206 to second contact pad 216 and first face 204. First contact pads 214 contact source and gate contacts of the vertical power transistor.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, comprising:
    providing a wafer having a first face and a second face opposite the first face;
    selectively doping the wafer via the first face to selectively form etch stop regions in the wafer, wherein selectively doping the wafer comprises:
        accelerating ions toward the first face of the wafer to selectively form etch stop regions that are between the first face and the second face and not on the first face;
    providing active areas on the first face of the wafer;
    attaching the wafer at the first face to a wafer carrier;
    etching the wafer at the second face to the etch stop regions; and
    removing, from the wafer carrier, a semiconductor device that includes one of the active areas at a first outward facing face of the semiconductor device and one of the etch stop regions at a second outward facing face of the semiconductor device.

2. The method of claim 1, wherein etching the wafer comprises:
    etching the wafer until semiconductor devices are singulated from the wafer.

3. The method of claim 1, wherein etching the wafer comprises:
    etching the wafer until contact pads on the first service are opened.

4. The method of claim 3, comprising:
    applying a metal layer over the opened contact pads.

5. The method of claim 4, comprising:
    singulating semiconductor devices from the wafer via severing at least one of the metal layer and the wafer.

6. The method of claim 3, comprising:
    applying a metal layer over the opened contact pads and the second face.

7. The method of claim 1, wherein providing active areas comprises:
    providing an array of integrated circuits on the first face.

8. The method of claim 1, wherein providing active areas comprises:
    providing an array of power transistors.

9. A method of manufacturing a semiconductor device comprising:
    providing a wafer having an array of active areas on a first face of the wafer that is opposite a second face of the wafer;
    selectively doping the wafer to form etch stop regions substantially between the active areas and the second face;
    attaching the wafer at the first face to a wafer carrier;
    etching the wafer until the active areas are singulated from the wafer; and
    removing, from the wafer carrier, a singulated semiconductor device that includes one of the active areas at a first outward facing face of the semiconductor device and one of the etch stop regions at a second outward facing face of the semiconductor device.

10. The method of claim 9, wherein etching the wafer comprises:
    etching the wafer at the second face to the etch stop regions.

11. The method of claim 9, comprising;
    grinding the wafer at the second face prior to etching the wafer.

* * * * *